US007091129B2

(12) United States Patent
Chau et al.

(10) Patent No.: US 7,091,129 B2
(45) Date of Patent: Aug. 15, 2006

(54) ATOMIC LAYER DEPOSITION USING PHOTO-ENHANCED BOND RECONFIGURATION

(75) Inventors: Robert S. Chau, Beaverton, OR (US); Matthew V. Metz, Hillsboro, OR (US); Scott A. Hareland, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/749,347

(22) Filed: Dec. 30, 2003

(65) Prior Publication Data

US 2005/0148206 A1 Jul. 7, 2005

(51) Int. Cl.
*H10L 21/302* (2006.01)
*H10L 21/461* (2006.01)
*H10L 21/31* (2006.01)
*H10L 21/469* (2006.01)

(52) U.S. Cl. .................. 438/707; 438/771; 438/785
(58) Field of Classification Search .......... 438/707, 438/771, 785
See application file for complete search history.

(56) References Cited

U.S. PATENT DOCUMENTS 4,067,893 A * 1/1978 Lander ..................... 556/35
2003/0031793 A1* 2/2003 Chang et al. .......... 427/255.28
2004/0245113 A1* 12/2004 Bokisa et al. ............ 205/252

* cited by examiner

*Primary Examiner*—William M. Brewster
(74) *Attorney, Agent, or Firm*—Blakely, Sokoloff, Taylor & Zafman LLP

(57) ABSTRACT

An atomic layer deposition process that reduces defective bonds formed when depositing atomic layers on a substrate or atomic layer when forming an integrated circuit device. As the layers are formed, a substrate or previous layer is exposed to a first reactant. After the substrate or layer has reacted with the first reactant, the substrate or layer is exposed to a second reactant. During or after exposure to the second reactant, electromagnetic radiation is applied to the substrate or layer. The electromagnetic radiation excites any defective bonds that may form in the deposition process to an energy level high enough to cause the elements forming the defective bonds to react with other elements contained in the second reactant. The reaction forms desirable bonds which attach to the substrate or previous layer to form an additional new layer.

12 Claims, 16 Drawing Sheets

ATOMIC LAYER DEPOSITION USING PHOTO-ENHANCED BOND RECONFIGURATION

FIELD

Atomic layer deposition.

BACKGROUND

Atomic layer deposition (ALD) is a deposition technique used to coat various features in the manufacturing process of circuit devices. To coat features, a film is grown layer by layer by exposing the surface to alternating pulses of reactants, each of which undergoes a self-limiting reaction, generally resulting in controlled film thickness. Each reactant exposure provides an additional atomic layer to previously deposited layers.

A film growth cycle generally consists of two pulses, each pulse being separated by purges. For oxide films, the substrate is first exposed to an oxidizing agent which results in oxygen bonding with the surface of the substrate or previous layer.

In the ideal case, the exposed surface fully reacts with the oxidizing agent, but not with itself. Next, a reactant is exposed to the surface. The reactant reacts with the previous layer to form a single atomic layer directly bonded to the underlying surface. Finally, an oxygen containing species is exposed to the substrate, which reacts with the reactant to form a finished layer.

The film growth cycle may be repeated as many times as necessary to achieve a desired film thickness. In theory, each deposited layer formed by this process is defect free. However, the practical aspects of ALD do not necessarily lead to such defect-free films in which all of the bonds are fully formed.

BRIEF DESCRIPTION OF THE DRAWINGS

Various embodiments are illustrated by way of example and not by way of limitation in the figures of the accompanying drawings in which like references indicate similar elements.

DETAILED DESCRIPTION

Figure 1:
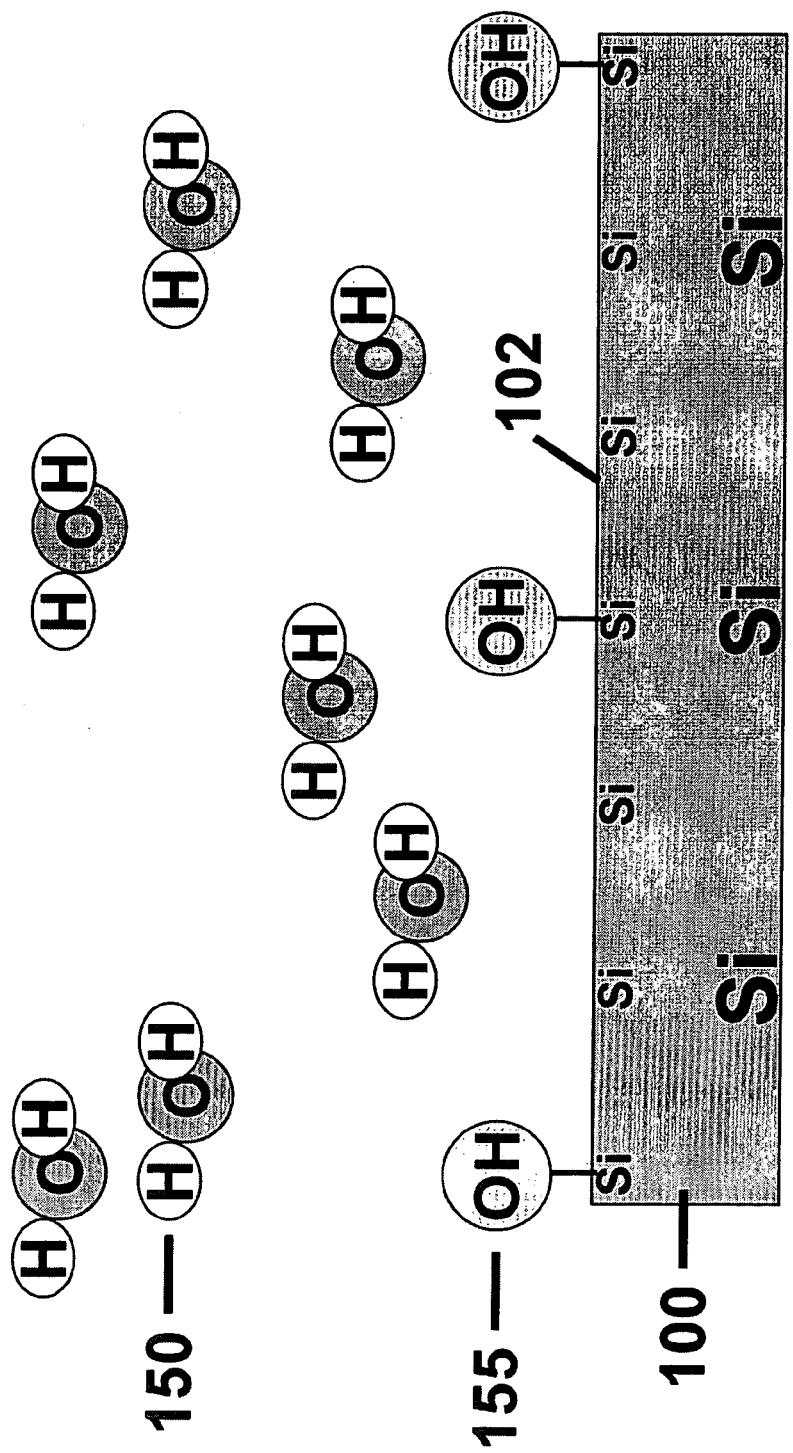
FIG. 1 shows a substrate, in one embodiment, being exposed to a first reactant.

FIG. 1 shows a semiconductor substrate such as a portion of a semiconductor wafer (e.g., silicon wafer). Substrate 100 may also be formed of gallium arsenide or any other material suitable for use as a semiconductor substrate (e.g., semiconductor on insulator structure). Reference to a silicon substrate will be made herein.

FIG. 1 shows substrate 100 being exposed to a first reactant in the formation of a binary metal oxide dielectric layer on surface 102 of substrate 100. First reactant 150, in one embodiment, is an oxygen source. In the embodiment shown in FIG. 1, first reactant 150 is water ($H_2O$). Other suitable oxygen sources include, but are not limited to, oxygen gas, ozone, peroxide and ammonium hydroxide ($NH_4OH$).

In FIG. 1, as substrate 100 is exposed to first reactant 150, substrate 100 reacts with first reactant 150 to form hydroxyl moieties (OH) 155 on surface 102 of substrate 100. In another embodiment, first reactant 150 is ammonia ($NH_3$). In embodiments where first reactant 150 is ammonia, $NH_2$ molecules form on surface 102 of substrate 100.

Figure 2:
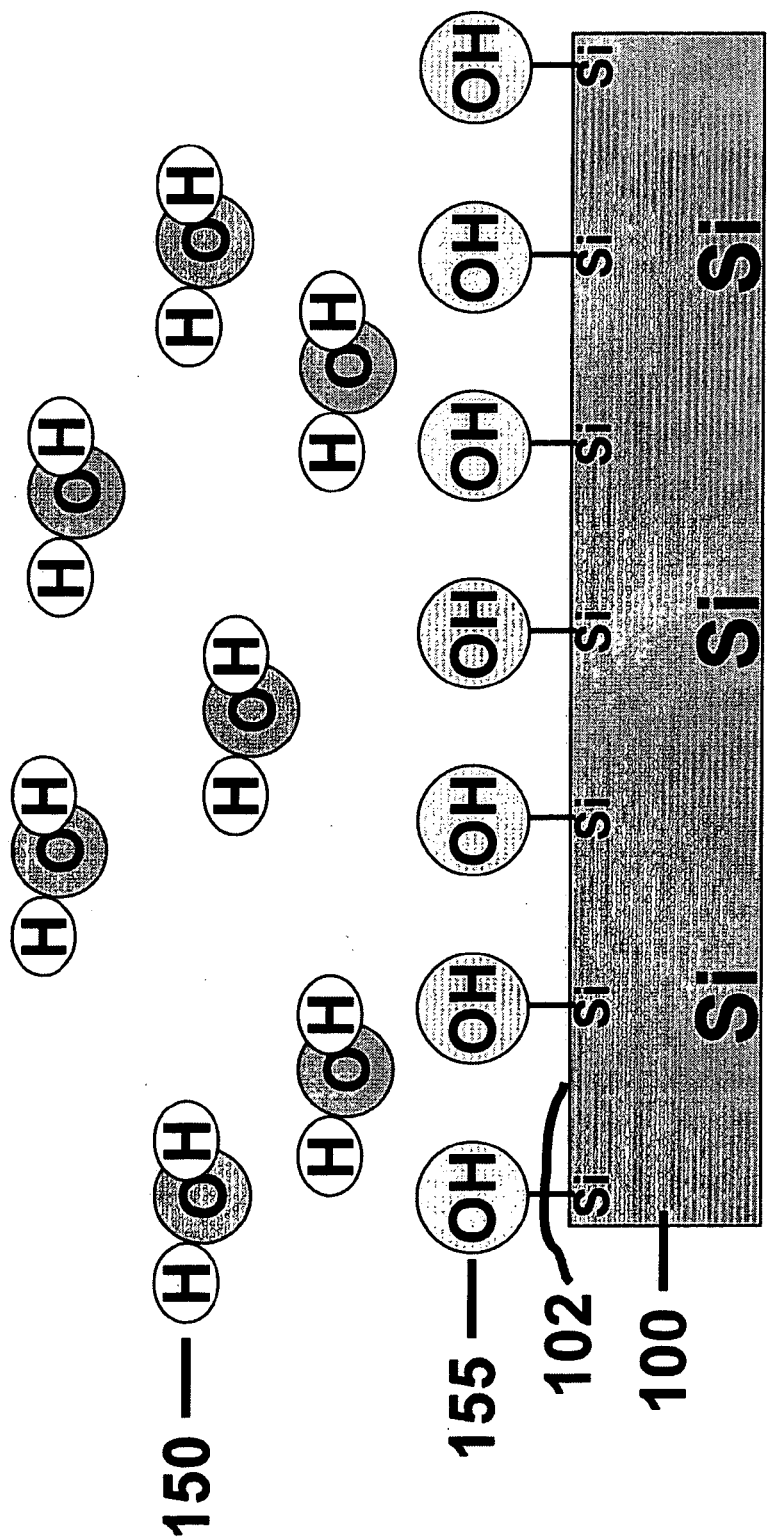
FIG. 2 shows the substrate of FIG. 1 in a hydroxyl-saturated state on a first surface.

FIG. 2 shows substrate 100 in a hydroxyl-saturated state. Hydroxyl saturation occurs when the surface of substrate 100 becomes saturated with hydroxyl moieties 155. Representatively, to achieve a hydroxyl-saturated state on a silicon substrate, substrate 100 is exposed to first reactant 150 for about 0.1 to about 300 seconds and may be exposed by way of submersing substrate 100 into a bath, spraying first reactant 150 over the surface of substrate 100, or any other method that substantially exposes substrate 100 to first reactant 150. As described, the reaction between substrate 100 and first reactant 150 is self-limiting in that there is limited available silicon with which first reactant 150 may react. Therefore, increasing the exposure of substrate 100 to first reactant 150 beyond a time period of complete saturation is acceptable.

Figure 3:
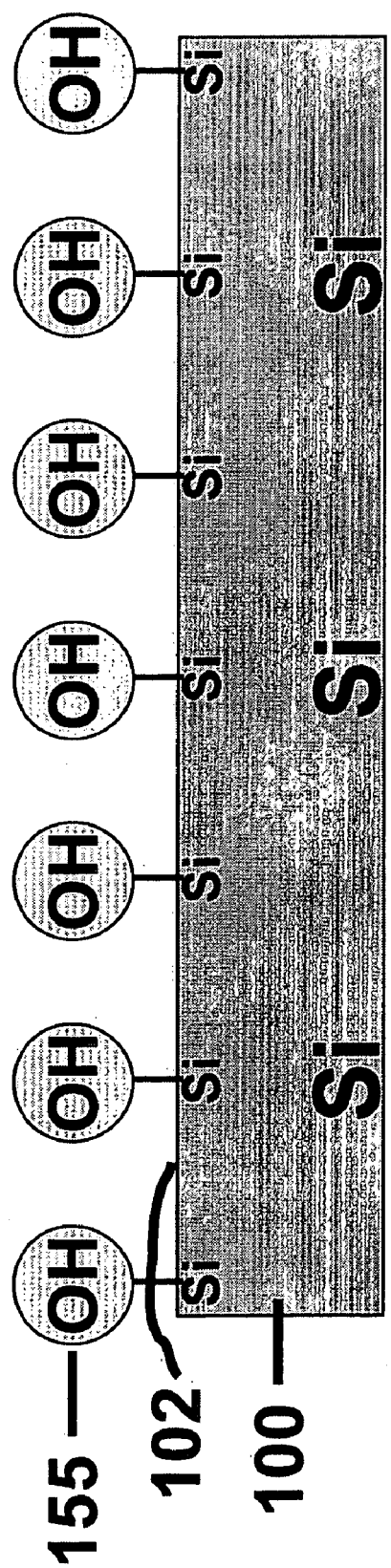
FIG. 3 shows the substrate of FIG. 2 purged of the first reactant.

FIG. 3 shows substrate 100 in a hydroxyl-saturated state after purging the reactant. Once hydroxyl saturation is achieved, substrate 100 is removed from the reactant-containing environment and may be dried.

Figure 4:
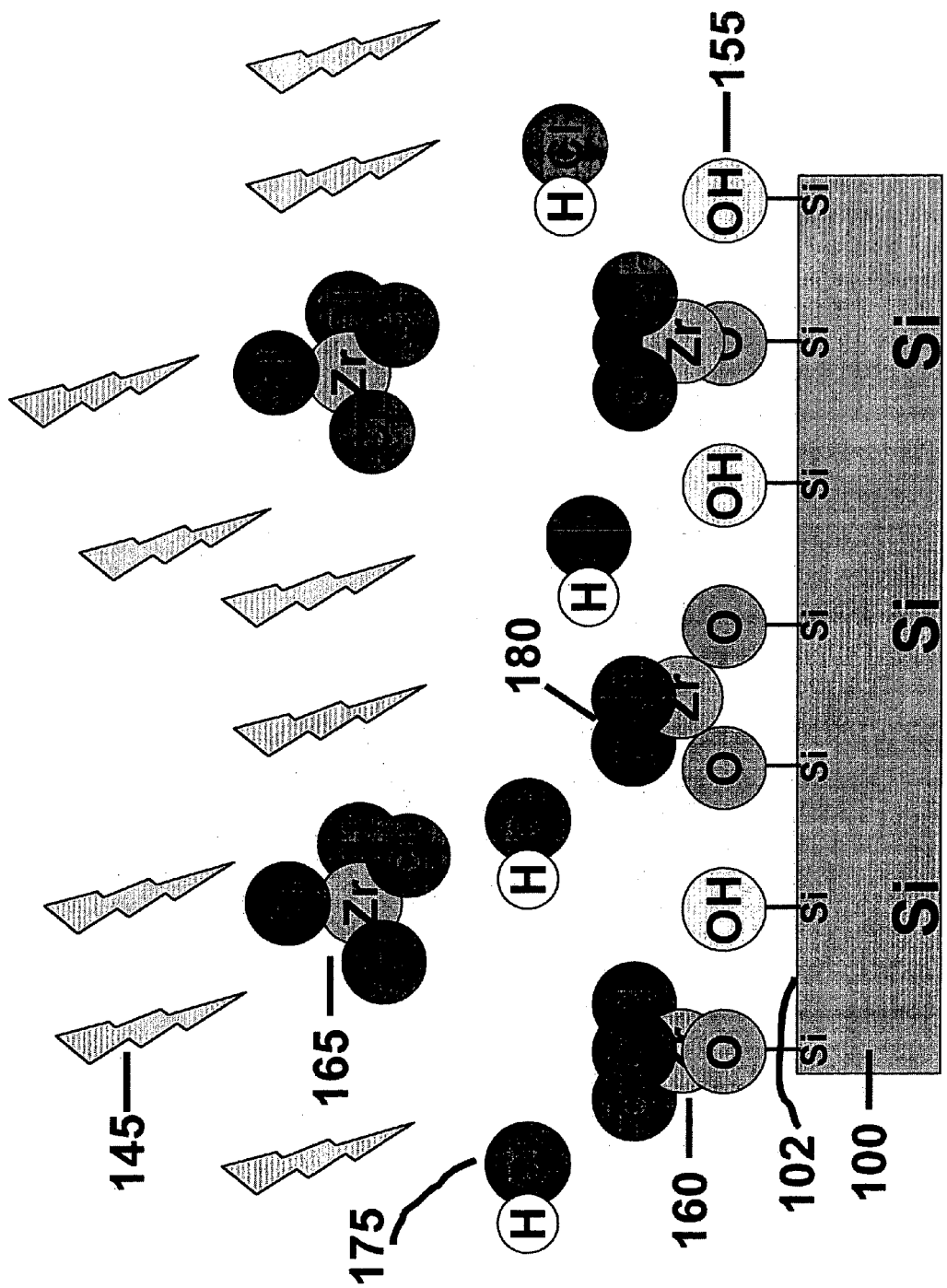
FIG. 4 shows the substrate of FIG. 3 being exposed to a second reactant and electromagnetic radiation.

FIG. 4 shows hydroxyl-saturated substrate 100 being exposed to a second reactant and electromagnetic radiation. In one embodiment, second reactant 165 is a metal-containing substance or compound (e.g., a salt). In the embodiment shown in FIG. 4, second reactant 165 is zirconium tetrachloride ($ZrCl_4$). Other suitable reactant substances include, but are not limited to, salts (e.g., chloride salts, fluoride salts, bromide salts, iodide salts, etc.) of titanium, aluminum, gallium, cesium, indium, hafnium, tantalum, praseodymium, niobium, scandium, lutetium, cerium and lanthanum. Second reactant 165, in general, is a metal chloride or any other suitable metal-containing substance or compound.

Hydroxyl-saturated substrate 100 is exposed to second reactant 165 by immersing substrate 100 into a bath containing second reactant 165, spraying second reactant 165 over the surface of substrate 100, or any other method that substantially exposes substrate 100 to second reactant 165.

As hydroxyl-saturated substrate 100 is exposed to second reactant 165, hydroxyl moieties 155 on surface 102 of substrate 100 begin to react with second reactant 165 to form, in one embodiment, $SiOZrCl_3$ molecules 160 on surface 102 of substrate 100 and free hydrochloric acid (HCl) 175. It is also possible for second reactant 165 to react with two hydroxyl moieties 155 to form $O_2ZrCl_2$ molecule 180 while releasing two equivalents of HCl 175.

Hydrochloric acid 175 is either in a liquid or gaseous state and is dispersed away from substrate 100 by a purge gas or vacuum in a chamber. Representatively, in a typical process to predominately or completely react hydroxyl moieties 155 with second reactant 165, substrate 100 is, for example, placed in an immersion bath for about 0.1 to about 300 seconds. As described, the reaction between hydroxyl moieties 155 and second reactant 165 is self-limiting in that there is limited available hydroxyls with which second reactant 165 may react. Therefore, increasing the exposure of substrate 100 to second reactant 165 beyond a time period of complete saturation is acceptable.

During the reaction of hydroxyl moieties 155 and second reactant 165, dangling bonds and reactant bonds can form. Dangling bonds occur when a reactant element, Zr in this example, bonds with another reactant element, Zr, instead of, in one case, an oxygen atom when forming an atomic layer film on a surface. Reactant bonds occur when a reactant compound, $ZrCl_4$ in this example, does not fully react with a reactant but instead bonds with desired bonds, Zr—O, to form Zr—Cl bonds in an ALD film layer.

During the early stages of film nucleation, dangling bonds and reactant bonds can alter the atomic configuration of the film and result in islanding and poor film growth. In addition, dangling bonds and reactant bonds inhibit the formation of subsequently deposited atomic layers.

To reduce or minimize the number of these defective bonds, substrate 100 is exposed to electromagnetic radiation 145 after hydroxyl/reactant bond formation. Substrate 100 may be exposed to electromagnetic radiation either while being exposed to second reactant 165, after removal of substrate 100 from a second reactant 165—containing environment, or both during exposure to second reactant 165 and after removal from a second reactant 165—containing environment. As defective bonds are exposed to electromagnetic radiation 145, the defective bonds become excited and rise to a greater energy level.

When the bonds reach an activation energy level, the bonds are in a state where they tend to seek out other elements with which to form new bonds. Thus, the electromagnetic radiation at the proper wavelength modifies the reaction kinetics to encourage the destruction of defective bonds and the formation of desirable bonds. For example, since the activation energy for the conversion of surface —$ZrCl_x$ to surface —$ZrCl_{x-1}$(OH) is approximately +1.6 kcal/mole, a photon-emitting device may be used to expose the target area to a wavelength that will cause energy levels to gain at least +1.6 kcal/mole. In one embodiment, the energy required to activate a reactant and/or dangling bond is insufficient to activate a desired bond (e.g., a Zr—O bond).

In one embodiment, electromagnetic radiation is supplied by a tunable laser. The tunable laser, in one embodiment, is a dye laser. In an embodiment where substrate 100 is a wafer, one technique for exposing substrate 100 to an electromagnetic radiation source is by revolving the wafer in the presence of a dye laser. The dye laser emits pulses of radiation onto the wafer along circular revolutions or rasters becoming subsequently larger or smaller as the laser is advanced from either a center or edge of the wafer, respectively. In one embodiment, a rastering speed is selected such that one or more pulses of a dye laser, for example, deliver sufficient energy to substrate 100 to activate undesired bonds (e.g., to deliver an energy to an undesired bond equal to or greater than an activation energy for the bond).

The selection of the wavelength of light depends on the type of defect encountered. In one embodiment, electromagnetic radiation 145 is targeted to an area of the electromagnetic spectrum wherein the defective bonds will become strongly excited, but the desired chemical bonds will remain unaffected. In one example, undesirable bonds such as Zr—Cl or Zr—Zr bonds in an ALD process for $ZrO_2$ formation would be targeted for a process using an oxygen source or a reactant such as $H_2O$ and $ZrCl_4$, respectively. In this example, the desired bonds in the matrix would include Si—O bonds near the substrate surface and Zr—O bonds in subsequent layers.

Figure 5:
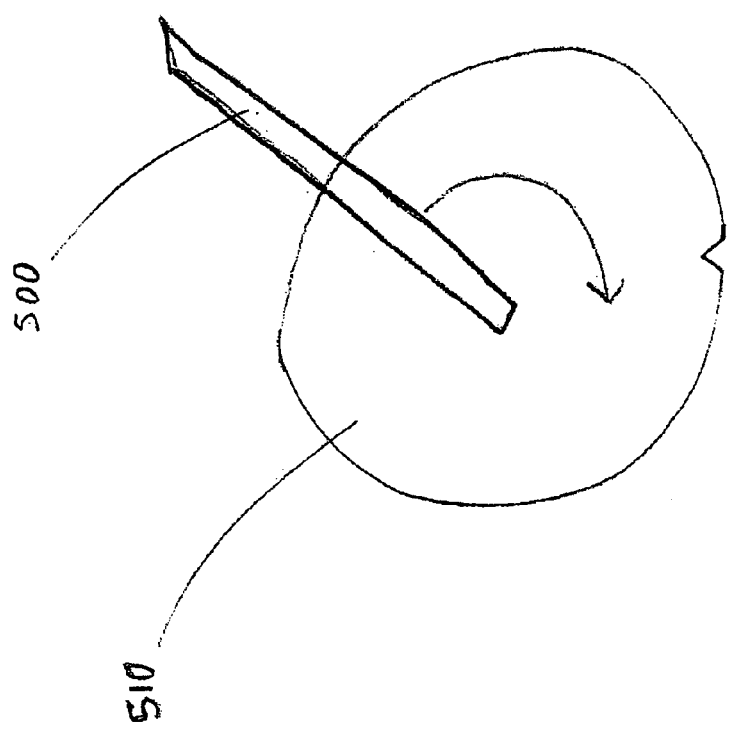
FIG. 5 shows a rastering configuration.

FIG. 5 shows a rastering configuration for exposing defect bonds to electromagnetic radiation. In this configuration, wafer 510 is on a pedestal or similar stag that can be rotated. Laser 500 scans across the surface of wafer 510 to remove any defective bonds. Laser 500 is adjustable such that laser 500 can emit wavelengths of light at pre-determined frequencies. Thus, wafer 510, and any defective bonds that may exist on wafer 510 in the dielectric layer, are exposed to enough electromagnetic radiation to excite the defective bonds as laser 500 scans across wafer 510.

Figure 6:
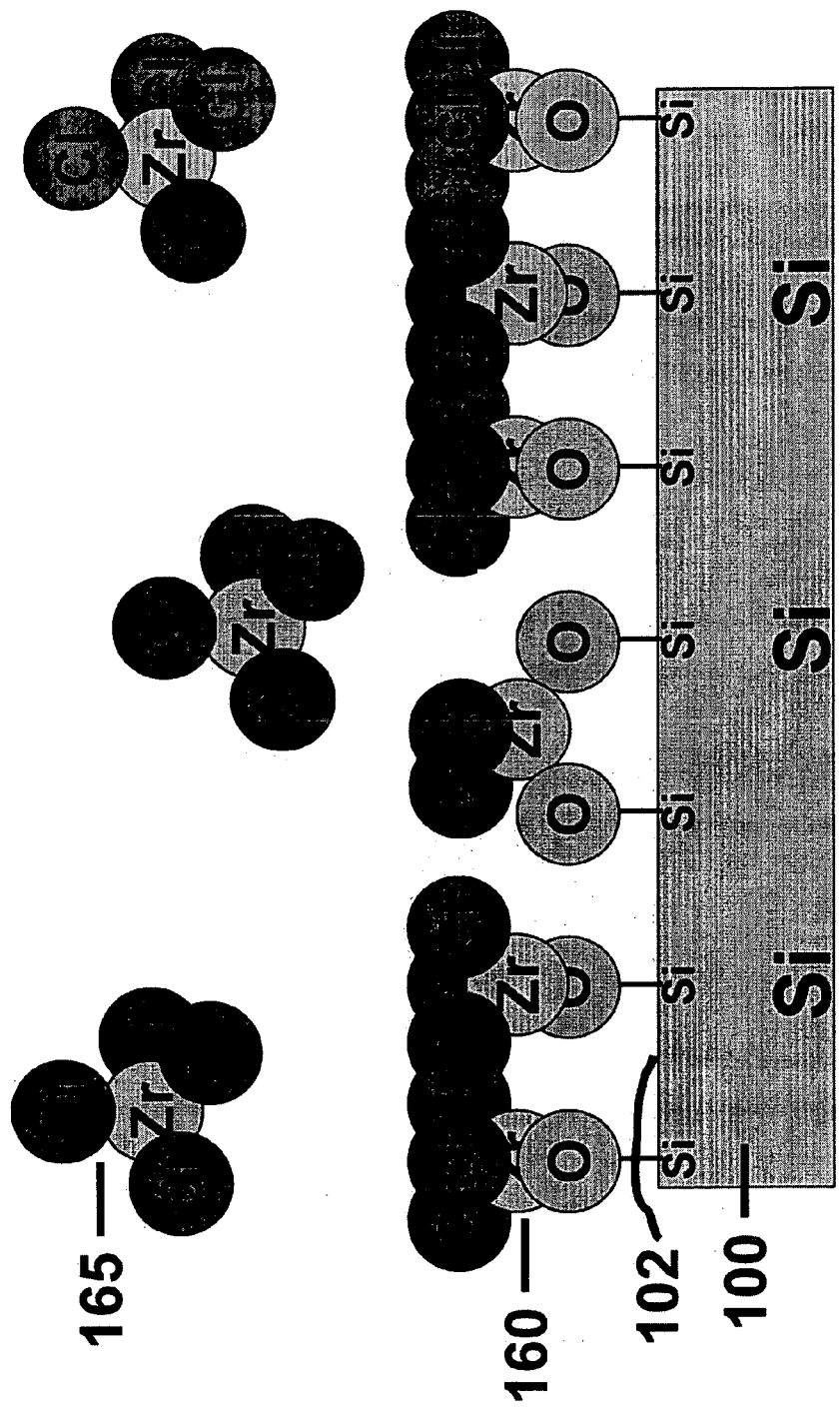
FIG. 6 shows the substrate of FIG. 4 in a reactant-saturated state.

FIG. 6 shows substrate 100 in a reactant-saturated state. In this state, the surface of substrate 100 containing SiOH bonds has reacted with the reactant to form $SiOZrCl_3$ molecules 160 on the surface of substrate 100.

Figure 7:
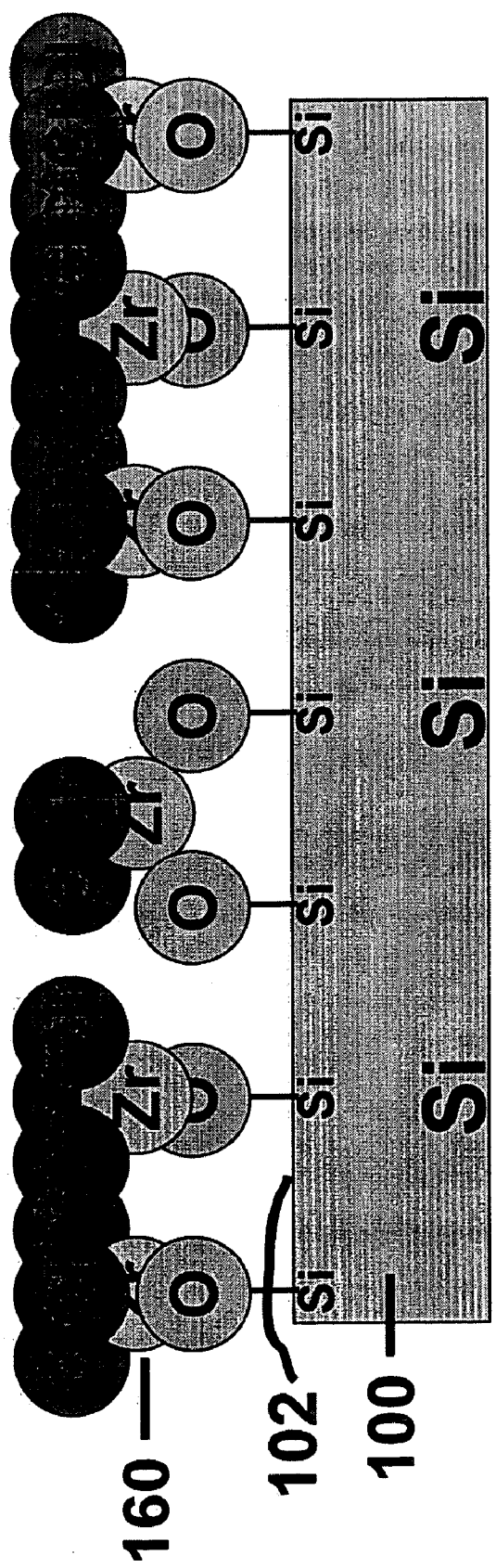
FIG. 7 shows the substrate of FIG. 6 purged of the reactant.

FIG. 7 shows the surface of substrate 100 saturated with $SiOZrCl_3$ molecules 160 after removal of the reactant and HCl. After surface 102 of substrate 100 is saturated with $SiOZrCl_3$ molecules 160, substrate 100 is removed from the reactant-containing environment and possibly dried. After substrate 100 is dried, $SiOZrCl_3$ molecule-saturated substrate 100 is exposed to another reactant.

Figure 8:
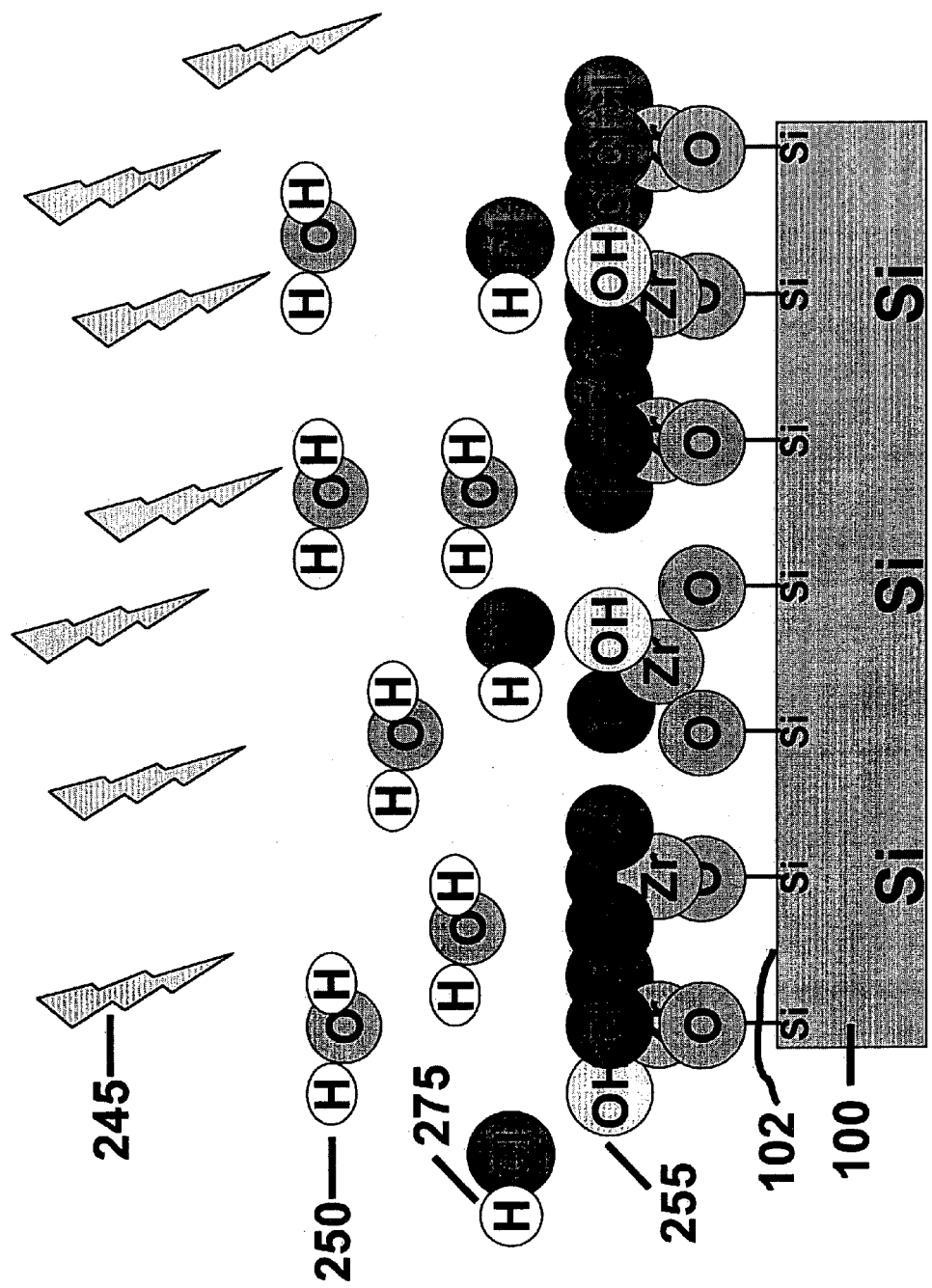
FIG. 8 shows the substrate of FIG. 7 exposed to a third reactant and electromagnetic radiation.

FIG. 8 shows $SiOZrCl_3$ molecule-saturated substrate 100 being exposed to a third reactant and electromagnetic. In one embodiment, third reactant 250 is an oxygen source. In another embodiment, third reactant 250 is ammonia. In the embodiment shown in FIG. 8, the oxygen source is $H_2O$. Other suitable oxygen sources include, but are not limited to, oxygen gas, ozone, peroxide and ammonium hydroxide.

In the embodiment shown in FIG. 8, when $SiOZrCl_3$ molecules 160 on surface 102 of substrate 100 are exposed to third reactant 250, a reaction occurs forming $SiOZr(OH)Cl_2$ molecules 255 on surface 102 of substrate 100 and free HCl molecules 275. In embodiments where third reactant 250 is ammonia, a reaction occurs forming $SiNZrCl_2NH_2$ molecules on surface 102 of substrate 100 and free HCl molecules 275.

Hydrochloric acid 275 is either in a liquid or gaseous state and is dispersed away from substrate 100 by a purge gas or vacuum in a chamber. Representatively, in a typical process to predominately or completely react $SiOZr(OH)Cl_2$ molecules 255 with third reactant 250, substrate 100 is, for example, placed in an immersion bath or sprayed for about 0.1 to about 300 seconds. As described, the reaction between $SiOZrCl_3$ molecules 160 and third reactant 250 is self-limiting in that there is limited available $SiOZrCl_3$ molecules 160 with which third reactant 250 may react. Therefore, increasing the exposure of substrate 100 to third reactant 250 beyond a time period of complete saturation is acceptable.

To reduce or minimize the number of defective bonds, substrate 100 is exposed to electromagnetic radiation 245 after hydroxyl bond formation. Electromagnetic radiation 245 may be any of the embodiments similar to electromagnetic radiation 145 discussed above.

Substrate 100 may be exposed to electromagnetic radiation 245 either while being exposed to third reactant 250, after removal of substrate 100 from a third-reactant 250—containing environment, or both during exposure to third reactant 250 and after removal from a third reactant 250—containing environment. As defective bonds are exposed to electromagnetic radiation 245, the defective bonds become excited and rise to a greater energy level.

When the bonds reach an activation energy level, the bonds are in a state where they tend to seek out other elements with which to form new bonds. Thus, the electromagnetic radiation at the proper wavelength modifies the reaction kinetics to encourage the destruction of defective bonds and the formation of desirable bonds. For example, since the activation energy for the conversion of surface —$ZrCl_x$ to surface —$ZrCl_{x-1}(OH)$ is approximately +1.6 kcal/mole, a photon-emitting device may be used to expose the target area to a wavelength that will cause energy levels to gain at least +1.6 kcal/mole. In one embodiment, the energy required to activate a reactant and/or dangling bond is insufficient to activate a desired bond (e.g., a Zr—O bond).

Figure 9:
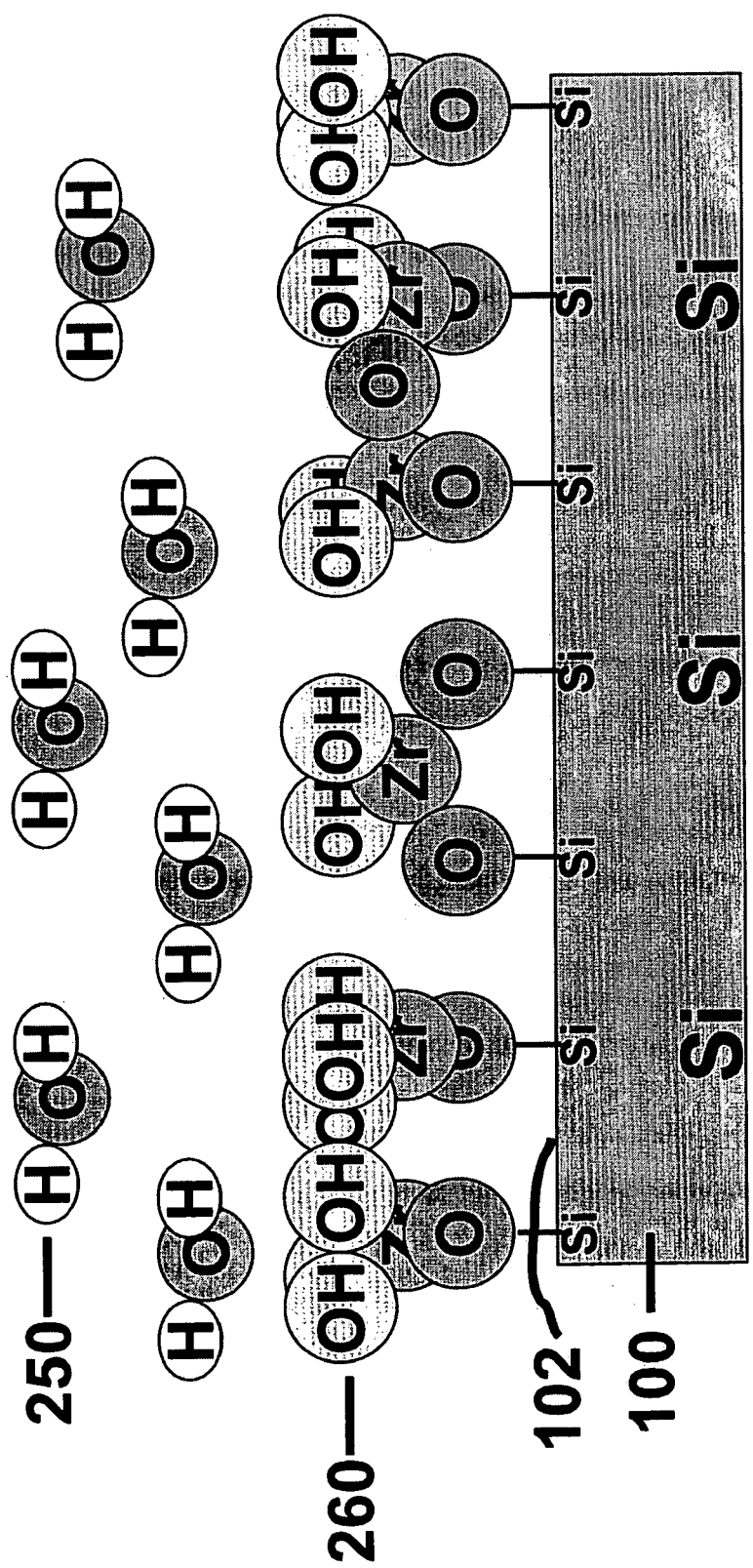
FIG. 9 shows the substrate of FIG. 8 in a hydroxyl-saturated state on a second surface.

FIG. 9 shows the surface of substrate 100 after third reactant 250 has fully reacted with the $SiOZrCl_3$ molecules. After the $SiOZrCl_3$ molecules have fully reacted with third reactant 250, the surface of substrate 100 becomes saturated with $SiOZr(OH)_3$ molecules 260 while forming additional free HCl molecules in a reaction represented by the equations:

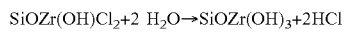

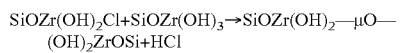

Figure 10:
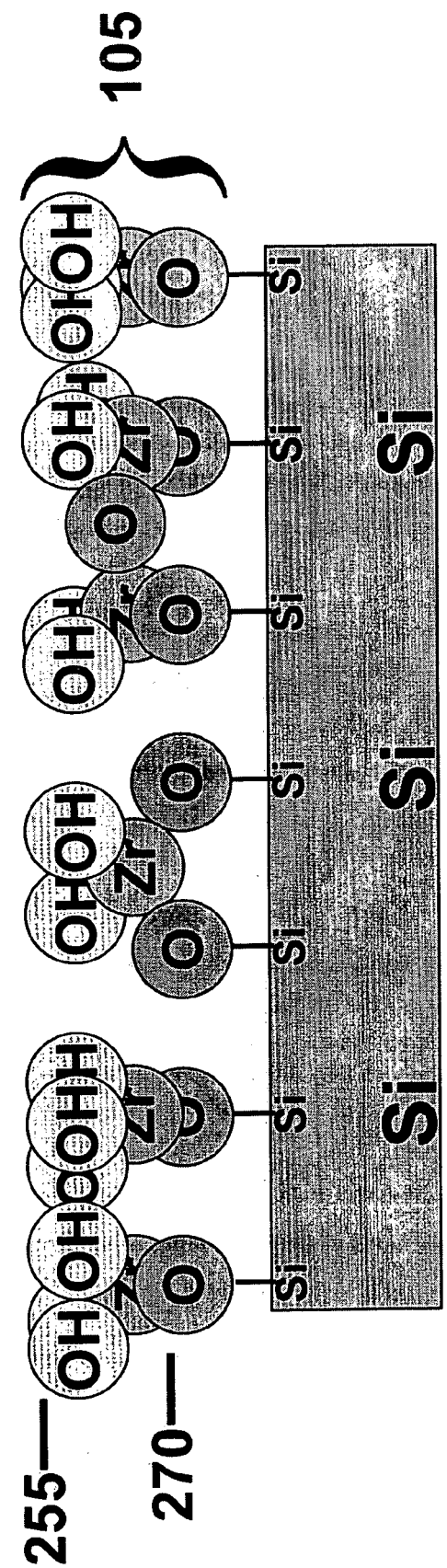
FIG. 10 shows the substrate of FIG. 9 purged of the reactant and forming an atomic layer.

FIG. 10 shows a finished first atomic layer formed by an ALD process after substrate 100 has been removed from the reactant-containing environment. In this example, atomic layer 105 is formed of zirconium oxide ($ZrO_2$) molecules 270 having hydroxyl moieties 255 bonded to $ZrO_2$ molecules 270. Atomic layer 105 is now prepared and capable of having an atomic layer formed upon it.

Figure 11:
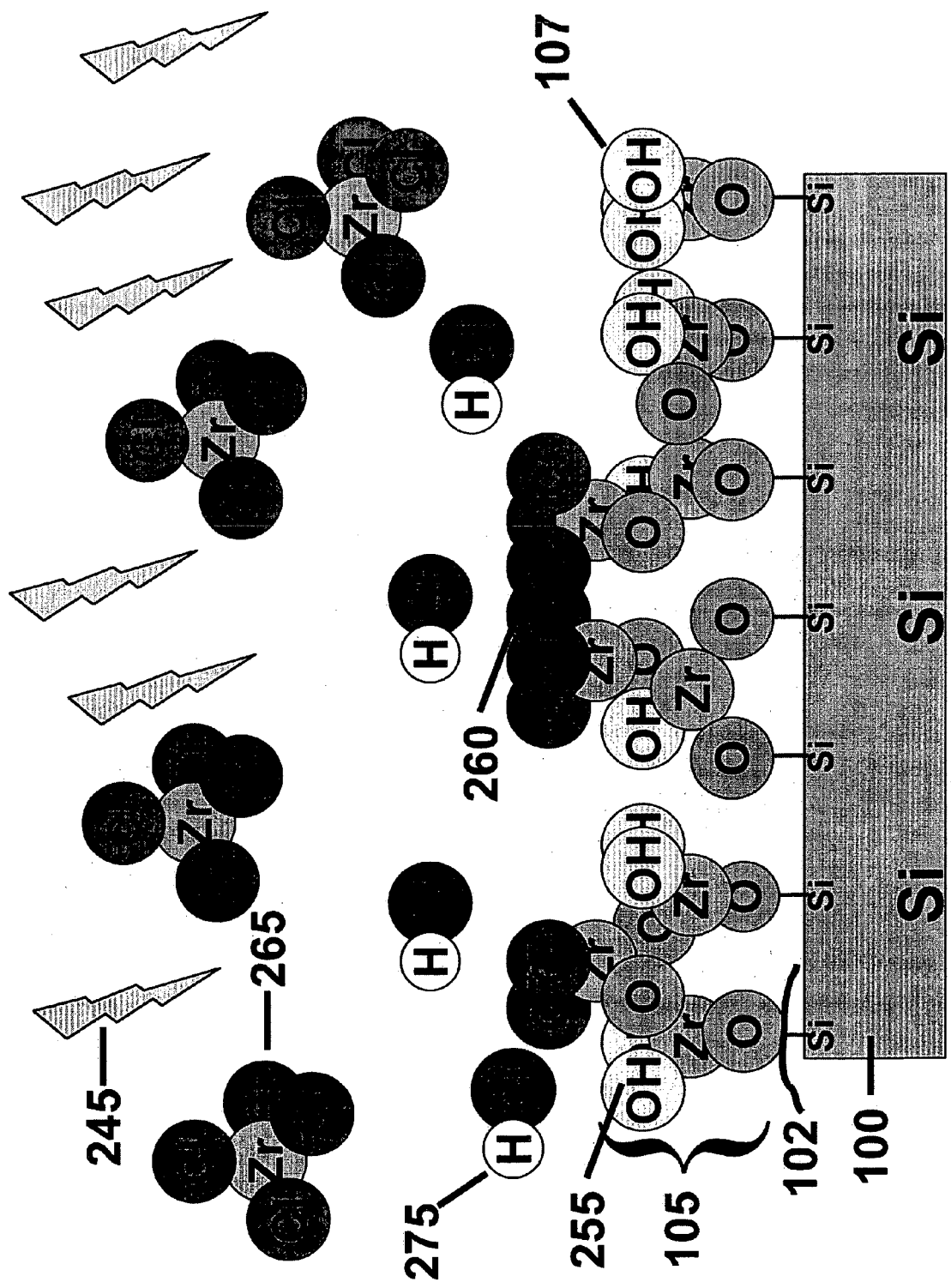
FIG. 11 shows an atomic layer, in one embodiment, being exposed to a fourth reactant.

FIG. 11 shows atomic layer 105 being exposed to a fourth reactant. In one embodiment, fourth reactant 265 is a metal-containing substance or compound (e.g., a salt). In the embodiment shown in FIG. 11, fourth reactant 265 is zirconium chloride. Other suitable reactant substances and compounds include, but are not limited to, salts (e.g., chloride salts, fluoride salts, bromide salts, iodide salts, etc.) of titanium, aluminum, gallium, cesium, indium, hafnium, tantalum, praseodymium, niobium, scandium, cerium, lutetium and lanthanum. Fourth reactant 265, in general, is a metal chloride or any other suitable metal-containing substance.

Layer 105 is exposed to fourth reactant 265 by immersing layer 105 into a bath containing fourth reactant 265, spraying fourth reactant 265 over surface 107 of layer 105, or any other method that substantially exposes layer 105 to fourth reactant 265. The exposure time should be long enough to maximize the reaction between layer 105 and fourth reactant 265. In one embodiment, layer 105 is exposed to fourth reactant 265 for about 0.1 to about 300 seconds, but because the reaction is self-limiting, a longer exposure time will not adversely affect dielectric layer formation.

As layer 105 is exposed to fourth reactant 265, the hydroxyl moieties 255 on surface 107 of layer 105 begin to react with fourth reactant 265 to form, in this embodiment, $ZrOZrCl_3$ molecules 260 on surface 107 of layer 105 and free hydrochloric acid 275. Hydrochloric acid 275 is either in a liquid or gaseous state and is dispersed away from layer 105 by a purge gas or vacuum in a chamber. Representatively, in a typical process to predominately or completely react hydroxyls 255 with fourth reactant 265, layer 105 is, for example, placed in an immersion bath or sprayed for about 0.1 to about 300 seconds. As described, the reaction between hydroxyl moieties 255 and fourth reactant 265 is self-limiting in that there is limited available hydroxyls with which fourth reactant 265 may react. Therefore, increasing the exposure of layer 105 to fourth reactant 265 beyond a time period of complete saturation is acceptable.

During the reaction of hydroxyl moieties 255 and fourth reactant 265 dangling and reactant bonds can form. To reduce or minimize the number of these defective bonds, layer 105 is exposed to electromagnetic radiation 245. Layer 105 may be exposed to electromagnetic radiation either while being exposed to fourth reactant 265, after removal of layer 105 from a fourth reactant 265—containing environment, or both during exposure to fourth reactant 265 and after removal from a fourth reactant 265—containing environment. In one embodiment, layer 105 is exposed to electromagnetic radiation 245 for about 0.1 to about 180 seconds. As the defective bonds are exposed to electromagnetic radiation 245, the defective bonds become excited and rise to a greater energy level.

Sufficient exposure to electromagnetic radiation 245 during, after or both during and after exposure to fourth reactant 265 allows layer 105 to become substantially defect-free. Layer 105 is substantially defect free because defective bonds that may have formed are excited by the electromagnetic radiation to a higher energy level causing the defect bonds to be more likely to react with a precursor to form non-defective sites, in this case, Zr—O bonds on the substrate. Thus, defect bonds are reduced or minimized since the reaction essentially replaces the undesired bonds on the layer with desirable bonds.

Figure 12:
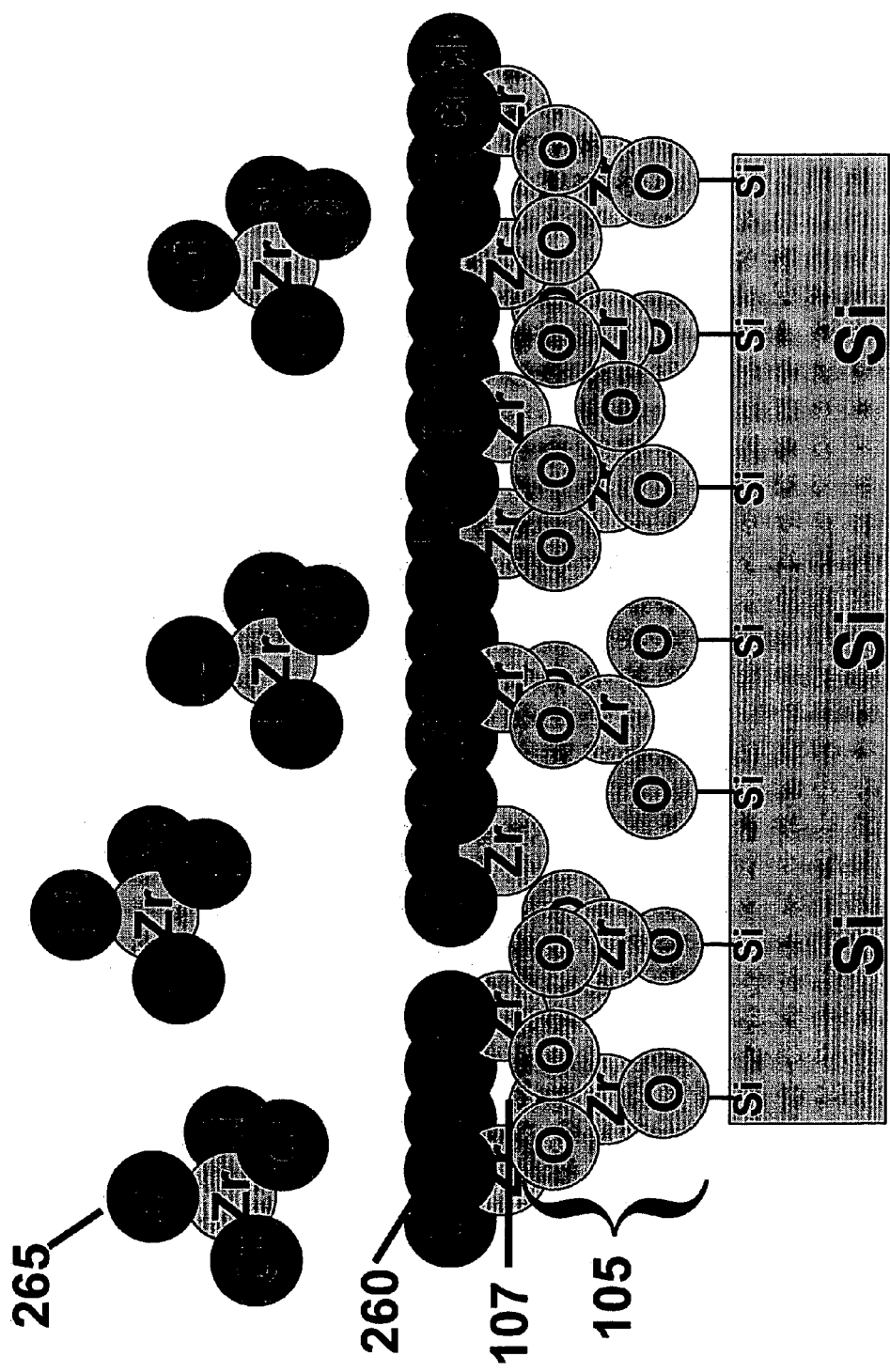
FIG. 12 shows the atomic layer of FIG. 11 in a reactant-saturated state.

FIG. 12 shows layer 105 in a reactant-saturated state. In this state, surface 107 of layer 105 containing ZrO(OH) bonds has reacted with the reactant to form $ZrOZrCl_3$ 260 molecules on surface 107 of layer 105

Figure 13:
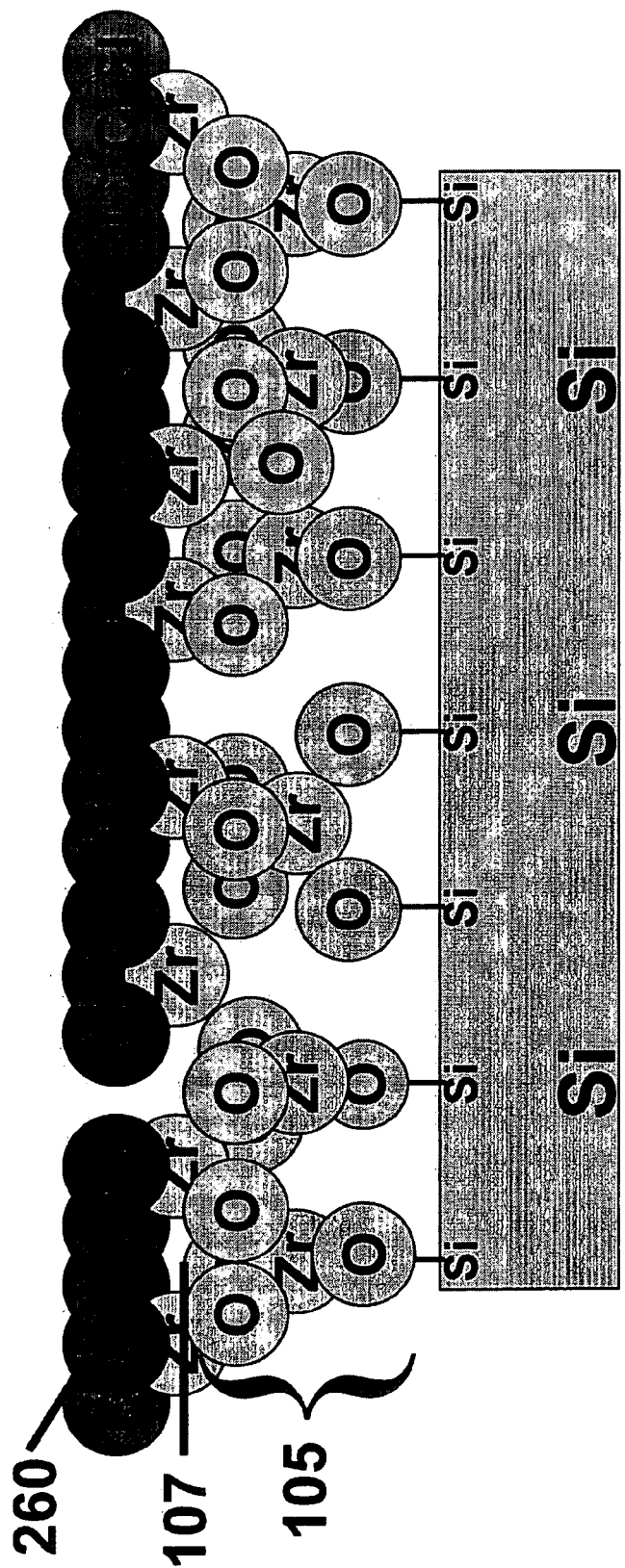
FIG. 13 shows the atomic layer of FIG. 12 purged of the reactant.

FIG. 13 shows surface 107 of layer 105 saturated with $ZrOZrCl_3$ molecules 260 after purging the reactant. After surface 107 of layer 105 is saturated with $ZrOZrCl_3$ molecules 260, layer 105 is removed from the reactant-containing environment and possibly dried. After layer 105 is dried, $ZrOZrCl_3$ molecule-saturated layer 105 is exposed to another reactant.

Figure 14:
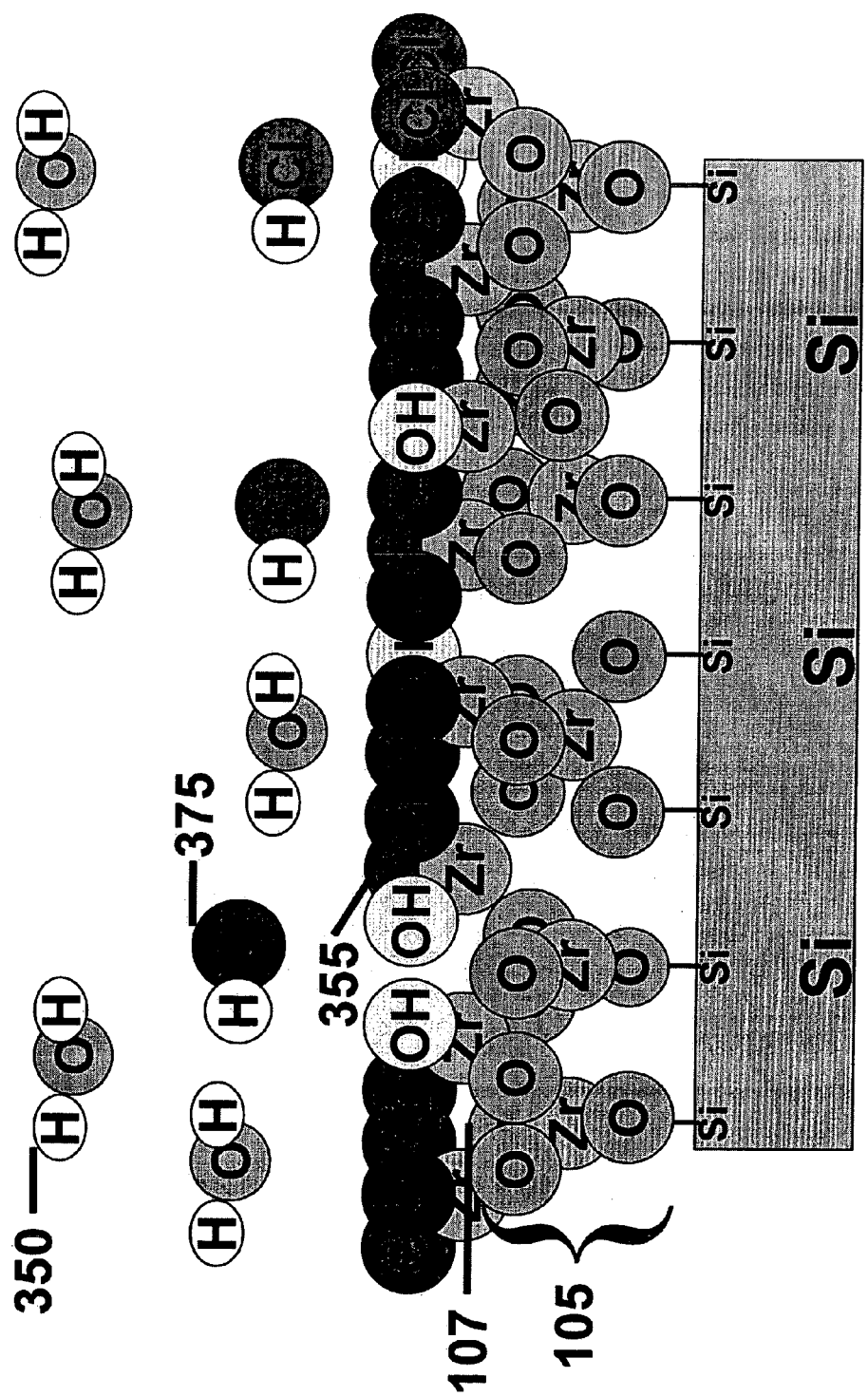
FIG. 14 shows the atomic layer of FIG. 13 being exposed to a fifth reactant.

FIG. 14 shows $ZrOZrCl_3$ molecule-saturated layer 105 being exposed to a fifth reactant. In one embodiment, fifth reactant 350 is an oxygen source. In another embodiment, fifth reactant 350 is ammonia. In the embodiment shown in FIG. 14, the oxygen source is $H_2O$. Other suitable oxygen sources include, but are not limited to, oxygen gas, ozone, peroxide and ammonium hydroxide.

In this embodiment, when $ZrOZrCl_3$ molecules on surface 107 of layer 105 are exposed to fifth reactant 350, a reaction occurs forming $ZrOZr(OH)Cl_2$ molecules 355 on surface 107 of layer 105 and free HCl molecules 375. In embodiments where third reactant 250 is ammonia, a reaction occurs forming ZrNZrCl$_2$NH$_2$ molecules on surface 107 of layer 105 and free HCl molecules 375.

Hydrochloric acid 375 is either in a liquid or gaseous state and is dispersed away from layer 105 by a purge gas or vacuum in a chamber. Representatively, in a typical process to predominately or completely react ZrOZrCl$_3$ molecules with fifth reactant 350, layer 105 is, for example, placed in an immersion bath or sprayed for about 0.1 to about 300 seconds. As described, the reaction between ZrOZrCl$_3$ molecules and fifth reactant 350 is self-limiting in that there is limited available ZrOZrCl$_3$ molecules with which fifth reactant 350 may react. Therefore, increasing the exposure of layer 105 to fifth reactant 350 beyond a time period of complete saturation is acceptable.

Figure 15:
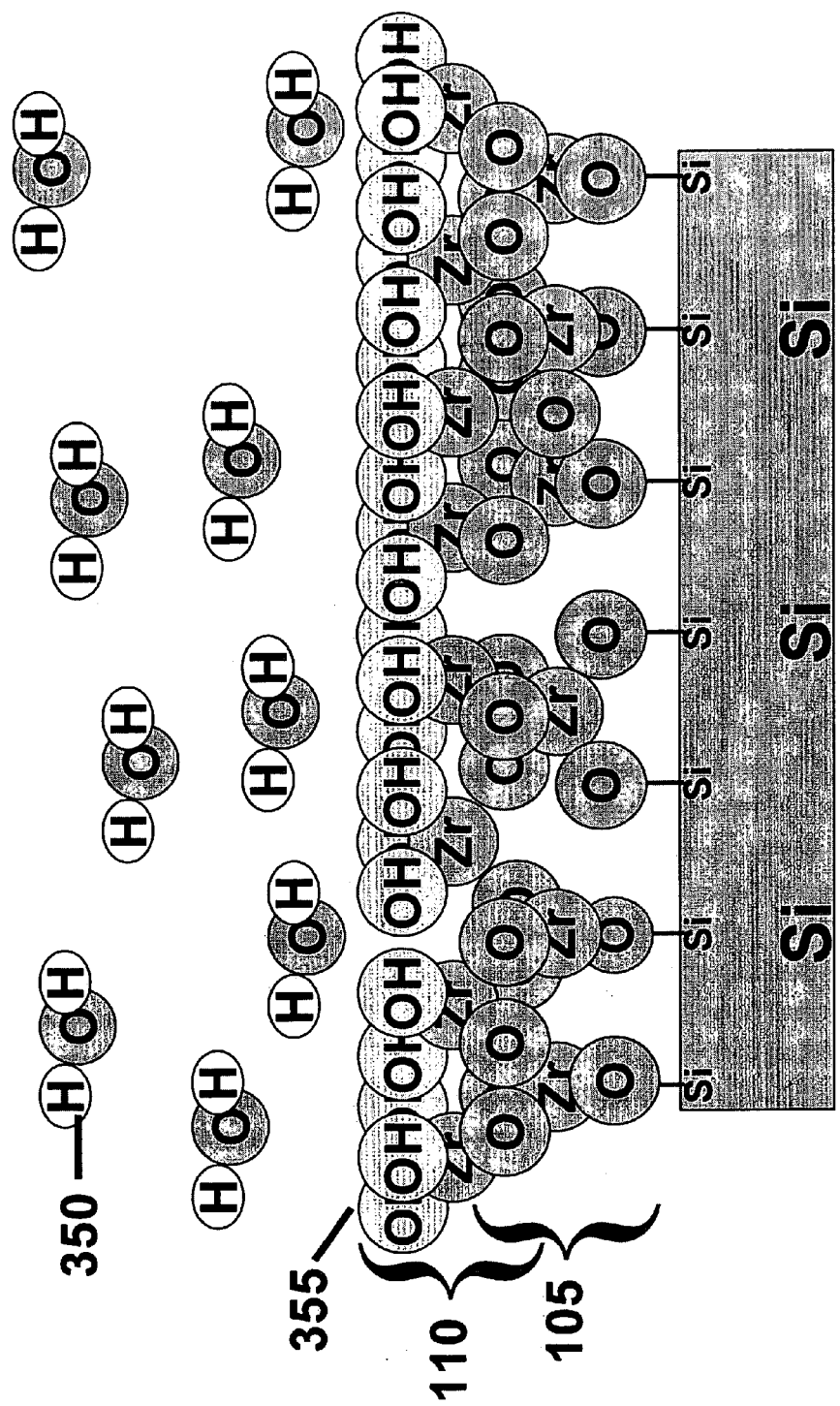
FIG. 15 shows the atomic layer of FIG. 14 in a hydroxyl-saturated state.

FIG. 15 shows the surface of layer 105 after fifth reactant 350 has fully reacted with the ZrOZrCl$_3$ molecules. After the ZrOZrCl$_3$ molecules have fully reacted with fifth reactant 350, surface 107 of layer 105 has become saturated with ZrOZr(OH)$_3$ molecules 355 while forming additional free HCl molecules in a reaction represented by the equations:

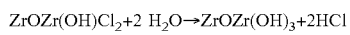

$$ZrOZr(OH)Cl_2 + 2\ H_2O \rightarrow ZrOZr(OH)_3 + 2HCl$$

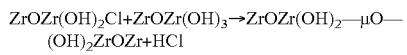

$$ZrOZr(OH)_2Cl + ZrOZr(OH)_3 \rightarrow ZrOZr(OH)_2 - \mu O - (OH)_2ZrOZr + HCl$$

Figure 16:
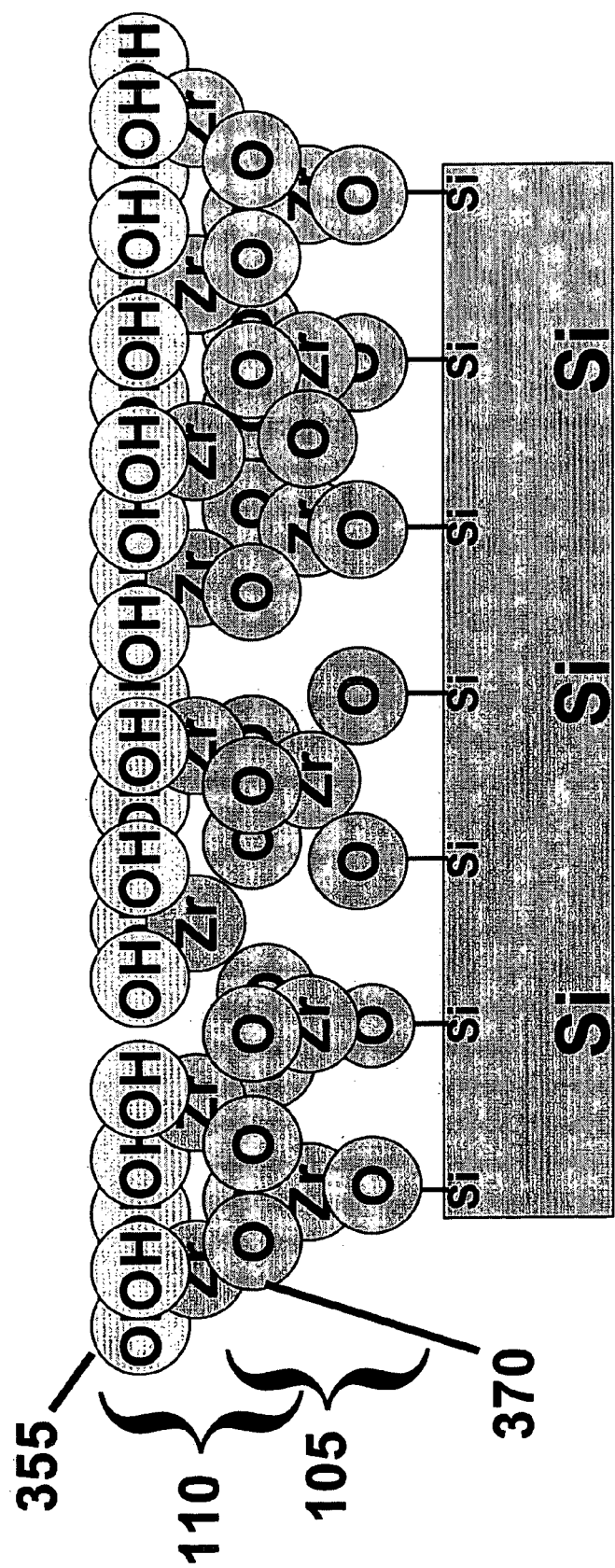
FIG. 16 shows the atomic layer of FIG. 15 purged of the reactant and forming a second atomic layer.

FIG. 16 shows a finished second atomic layer formed by an ALD process after layer 105 has been removed from the reactant-containing environment. Second layer 110 is formed of ZrO molecules 370 having OH molecules 355 bonded to ZrO molecules 370. Layer 110 is now prepared and capable of having an atomic layer formed upon it.

The process of forming individual layers upon previous layers may be repeated until the number of desired layers and/or film thickness is reached. As each layer is deposited without defects, overall device integrity and manufacturing yield increases.

In the foregoing specification, the invention has been described with reference to specific embodiments thereof. It will, however, be evident that various modifications and changes can be made thereto without departing from the broader spirit and scope of embodiments of the invention as set forth in the appended claims. The specification and drawings are, accordingly, to be regarded in an illustrative rather than a restrictive sense.

What is claimed is:

1. A method, comprising:
   forming a film with an atomic layer deposition (ALD) containing metal-metal bonds and metal-oxide bonds, subsequently applying energy to said film sufficient to disassociate the metal-metal bonds, but insufficient to disassociate the metal-oxide bonds.

2. The method of claim 1, further comprising: after exciting the undesirable bond, exposing the film to a reactant.

3. The method of claim 2, wherein the reactant is an oxygen source.

4. The method of claim 3, wherein the oxygen source is water.

5. The method of claim 2, wherein the reactant comprises a metal precursor.

6. The method of claim 5, wherein the metal is one of zirconium, titanium, aluminum, gallium, cesium, indium, hafnium, tantalum, praseodymium, niobium, scandium, lutetium, cerium and lanthanum.

7. The method of claim 1, wherein forming a film comprising introducing a metal precursor, wherein the metal of the metal precursor is selected from a group consisting of zirconium, titanium, aluminum, gallium, cesium, indium, hafnium, tantalum, praseodymium, niobium, scandium, lutetium, cerium and lanthanum.

8. The method of claim 1, wherein the film is a metal oxide film.

9. The method of claim 1, wherein exciting the undesirable bonds comprises exposing the undesirable bonds to electromagnetic radiation.

10. A method, comprising:
    forming a film with an tomic layer deposition (ALD) containing metal-metal bonds and metal-oxide bonds, subsequently applying energy to said film sufficient to disassociate the metal-metal bonds, but insufficient to disassociate the metal-oxide bonds; and
    exposing the film to a reactant.

11. The method of claim 10, wherein modifying the undesirable bonds comprises reducing the number of undesirable bonds on the film.

12. The method of claim 10, wherein modifying the undesirable bonds comprises minimizing the number of undesirable bonds on the film.

* * * * *

UNITED STATES PATENT AND TRADEMARK OFFICE
CERTIFICATE OF CORRECTION

PATENT NO. : 7,091,129 B2  Page 1 of 1
APPLICATION NO. : 10/749347
DATED : August 15, 2006
INVENTOR(S) : Chau et al.

It is certified that error appears in the above-identified patent and that said Letters Patent is hereby corrected as shown below:

On the Title Page, Item (75), at line 3 of the Inventors, delete "Tigard, OR" and insert --Lino Lakes, MN--.

In column 8, at line 21, delete "forming a com-".

In column 8, at line 22, delete "prising introducing a metal precursor, wherein the metal of".

In column 8, at line 23, delete "precursor".

Signed and Sealed this

Thirtieth Day of October, 2007

JON W. DUDAS
*Director of the United States Patent and Trademark Office*